United States Patent [19]

Cunningham et al.

[11] Patent Number: 5,555,199
[45] Date of Patent: Sep. 10, 1996

[54] AUTOMATIC DESIGN PROCESS AND APPARATUS

[75] Inventors: Padraig Cunningham; Barry Smyth, both of Dublin, Ireland

[73] Assignee: Hitachi, Ltd., Tokyo, Japan

[21] Appl. No.: 98,776

[22] Filed: Jul. 29, 1993

[30]    Foreign Application Priority Data

Jul. 31, 1992 [IE]  Ireland ................................ 922530

[51] Int. Cl.$^6$ ............................................. G06F 17/00
[52] U.S. Cl. ............................ 364/578; 395/77; 395/53; 395/500
[58] Field of Search .................... 395/77, 53, 52, 395/500; 364/578, 474.24

[56]              References Cited

U.S. PATENT DOCUMENTS

| | | | |
|---|---|---|---|
| 5,016,204 | 5/1991 | Simoudis et al. | 364/578 |
| 5,101,362 | 3/1992 | Simoudis | 395/53 |
| 5,208,768 | 5/1993 | Simoudis | 364/578 |
| 5,218,557 | 6/1993 | Simoudis | 364/578 |
| 5,224,206 | 6/1993 | Simoudis | 395/77 |
| 5,269,014 | 12/1993 | Ogino | 395/500 |
| 5,283,857 | 2/1994 | Simoudis | 395/77 |
| 5,293,585 | 3/1994 | Morita | 395/52 |
| 5,297,054 | 3/1994 | Kienzle et al. | 364/474.24 |

FOREIGN PATENT DOCUMENTS

0343682A2  11/1989  European Pat. Off. .
  2187004   8/1987  United Kingdom .

OTHER PUBLICATIONS

Smyth et al., "Deja Vu: a hierarchical case–based reasoning system for software design", 1992. (Abstract only).
Smyth et al., "A blackboard based, recursive, case–based reasoning system for software development", 1993. (Abstract only).
Artificial Intelligence in Design, Maher et al., "CADSYN: Using case and decomposition knowledge for design synthesis", Jun. 1991, pp. 137–150.
A. I. for Engineering Design, Analysis and Manufacturing, vol. 3, No. 2, 1989, Howard et al., "Applying Design–Dependent Knowledge in Structural Engineering", pp. 11–123.
Engineering Applications of Artificial Intelligence, vol. 5, No. 4, Jul. 1992, Lee et al., "Towards a Knowledge–based Design Assistant", pp. 275–287.
International Workshop on A. I. for Industrial Applications 1988, Ono et al. "Artificial Intelligence based Programmable Controller Software Designing", pp. 85–90.
IEEE Expert, vol. 3, No. 4, 1988, New York, NY, Luqi, "Knowledge–based Support for Rapid Software Prototyping", pp. 9–18.

*Primary Examiner*—Emanuel T. Voeltz
*Assistant Examiner*—Patrick J. Assovad
*Attorney, Agent, or Firm*—Antonelli, Terry, Stout & Kraus

[57]              ABSTRACT

This invention refers to an automatic design process comprising the steps of:- (1)writing a target specification of an item to be designed to a partitioned section of a memory circuit; (2)automatically determining an address for a case stored in a case-base by reference to the target specification; (3)retrieving the case from the case-base and writing the retrieved case to a partitioned section of the memory circuit; and (4)adapting the retrieved case into conformity with the target specification, and writing the adapted case to a partitioned section of the memory circuit as a target solution. Preferably, the process further comprises successive cycles of retrieving a case and adapting the retrieved case, each cycle being initiated by writing of a target specification representing a component of the item to the target specification section of the memory circuit.

14 Claims, 10 Drawing Sheets

AUTOMATIC DESIGN PROCESS AND APPARATUS

BACKGROUND OF THE INVENTION

The invention relates to the automatic design of items such as computer programs or indeed mechanical or electromechanical consumer goods.

Heretofore, attempts have been made at automatic design of items. For example, European Patent Specification No. EP 0343682A2 (Mitsubishi) describes an automatic programming system in which efficiency of testing is improved by coupling of design and test stages. While the process shown in this specification is apparently quite efficient at generating computer programs, it does not make use of existing cases, i.e. computer programs which have already been developed and which may be quite similar to the target computer program. Thus, the process is not inherently as efficient as it could possibly be if use were made of existing cases. It is worth noting that this process has a narrow range of uses because it is restricted to development of computer programs, and indeed a particular type of computer program. This is because a very large amount of knowledge must be stored where development/design is from "first principle". British Patent Specification No. GB 2187004B (STC) describes an automatic inspection system in which existing signal processing modules are selected to construct a target system for a particular use. However, in many circumstances it is not possible to make use of a library of existing modules, especially one of which is ideally suitable for a particular target product. In these cases, adaptation of existing modules is required, and where this is the case, the tendency has been for development to be carried out manually, using human intuition.

SUMMARY OF THE INVENTION

It is therefore an object of the present invention to provide a process and apparatus for the automatic design or development of products, which process has the versatility of human expertise but carries out the task much more efficiently.

According to the invention, there is provided an automatic design process comprising the steps of:

writing a target specification of an item to be designed to a partitioned section of a memory circuits;

automatically determining an address for a case stored in a case-base by reference to the target specification;

retrieving the case from the case-base and writing the retrieved case to a partitioned section of the memory circuit; and adapting the retrieved case into conformity with the target specification, and writing the adapted case to a partitioned section of the memory circuit as a target solution.

Preferably, the process further comprises successive cycles of retrieving a case and adapting the retrieved case, each cycle being initiated by writing of a target specification representing a component of the item to the target specification section of the memory circuit.

In one embodiment, the case-base has a partonomic structure of cases i.e., the case-base includes higher level cases that are decomposable into lower level, more detailed cases which form parts of the higher-level cases), and the step of writing a target specification of an item component, involves writing a retrieved and adapted high-level (decomposable) case forming part of the solution.

Ideally, the adapted solution is written to an adaptation section of the memory circuit, and is subsequently read before being written to a solution section of the memory circuit so that it is integrated with other parts of the solution.

In one embodiment, the case-base has a taxonomic structure (i.e.) arranged in classifications, and the step of automatically determining an address for a case comprises the sub-step of referencing classification features of the target specification. In this embodiment, cases in the case-base are preferably linked by a partonomic structure, and there is a further sub-step of referencing internal features of the target specification to select a closest-match case for retrieval.

Ideally, the step of writing the retrieved case to the memory circuit comprises the sub-steps of automatically identifying differences between the retrieved case and the target specification, and writing the differences as mapping links to a partitioned section of the memory circuit for reference during adaptation.

In another embodiment, the step of writing a target specification to the memory circuit comprises the sub-steps of receiving from a user and writing a high-level target specification to a partitioned section of the memory circuit, and subsequently automatically analyzing the high-level target specification and writing the resultant detailed target specification to another partitioned section of the memory circuit, the detailed target specification being subsequently used in the design process.

According to another aspect, the invention provides an apparatus for the carrying out of an automatic design process, the apparatus comprising:

a memory circuit having partitioned sets of locations forming sections, one section storing addresses for cases stored in a casebase;

a retrieval processing agent comprising means for determining parameters for access to a case in the case-base and accessing the case-base by reference to the casebase memory circuit section, the retrieval processing agent further comprising means for writing a retrieved case to a preselected partitioned memory circuit section;and an adaptation processing agent comprising means for reading the retrieved case, automatically adapting the retrieved case and writing the adapted case to a preselected partitioned memory circuit section.

Preferably, the apparatus further comprises an integration processing agent comprising means for reading an adapted case and writing the adapted case to a pre-selected partitioned memory circuit section so that it is integrated with a solution already written to the same section.

In one embodiment, the apparatus further comprises a decomposition processing agent comprising means for reading a portion of the solution in the solution section of the memory circuit, and writing said portion to a target specification of the memory circuit so that a further cycle of retrieval and adaptation is initiated.

In further embodiment, the apparatus further comprises an analysis processing agent comprising means for reading a high-level target specification to generate a detailed target specification, and means for writing the detailed target specification to a pre-selected partitioned memory circuit section.

The invention will be more clearly understood from the following description of some embodiments thereof, given by way of example only with reference to the accompanying drawings.

DETAILED DESCRIPTION OF THE PREFERRED EMBODIMENTS

Figure 1:
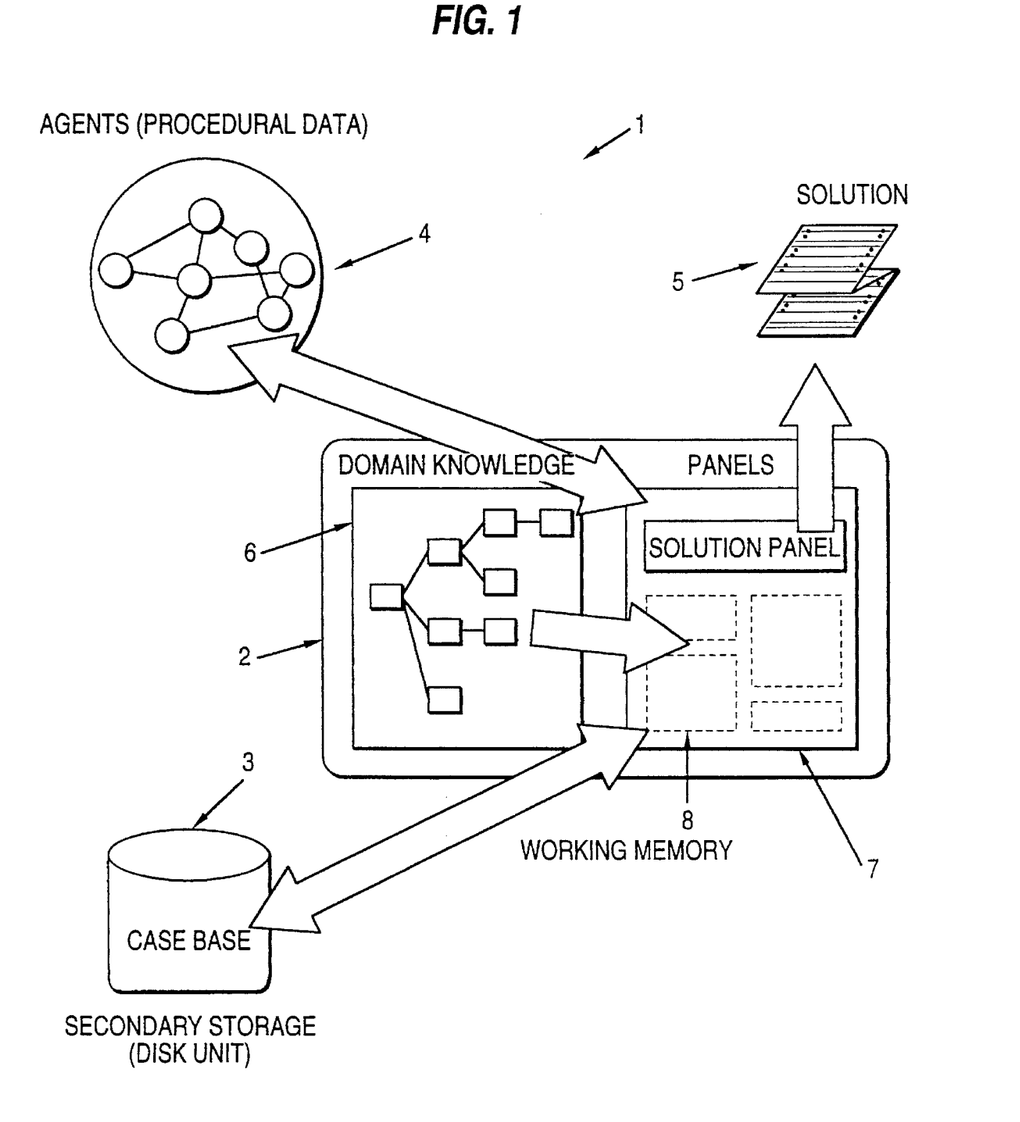
FIG. 1 is a diagramatic view showing an automatic design apparatus of the invention.

Referring to the drawings, and initially to FIG. 1 there is illustrated an apparatus 1 for the carrying out of an automatic design process of the invention. The items which could be designed by the process include software code for control of a particular item such as a loading vehicle, or alternatively for design of a vehicle or other item. In the examples which follow, the invention is described for automatic generation of software code for carrying out various tasks. It will be appreciated, however, that the invention applies to any other type of design problem.

The apparatus 1 comprises a memory circuit 2, a storage device 3 and various processors or processing agents 4 which are interconnected. A paper output containing the design solution is represented by the numeral 5. In more detail, the memory circuit 2 is partitioned into two main areas, namely, a set of locations 6 storing a domain model, and various memory sections or panels represented generally by the reference numeral 7. The domain model 6 includes data which may be useful to the apparatus 1 in operation. One of the panels, namely 8, has stored addresses for a case-base 10 in the storage device 3. The case base includes data relating to a large number of existing cases which have already been designed for different prior target specifications.

Figure 2:
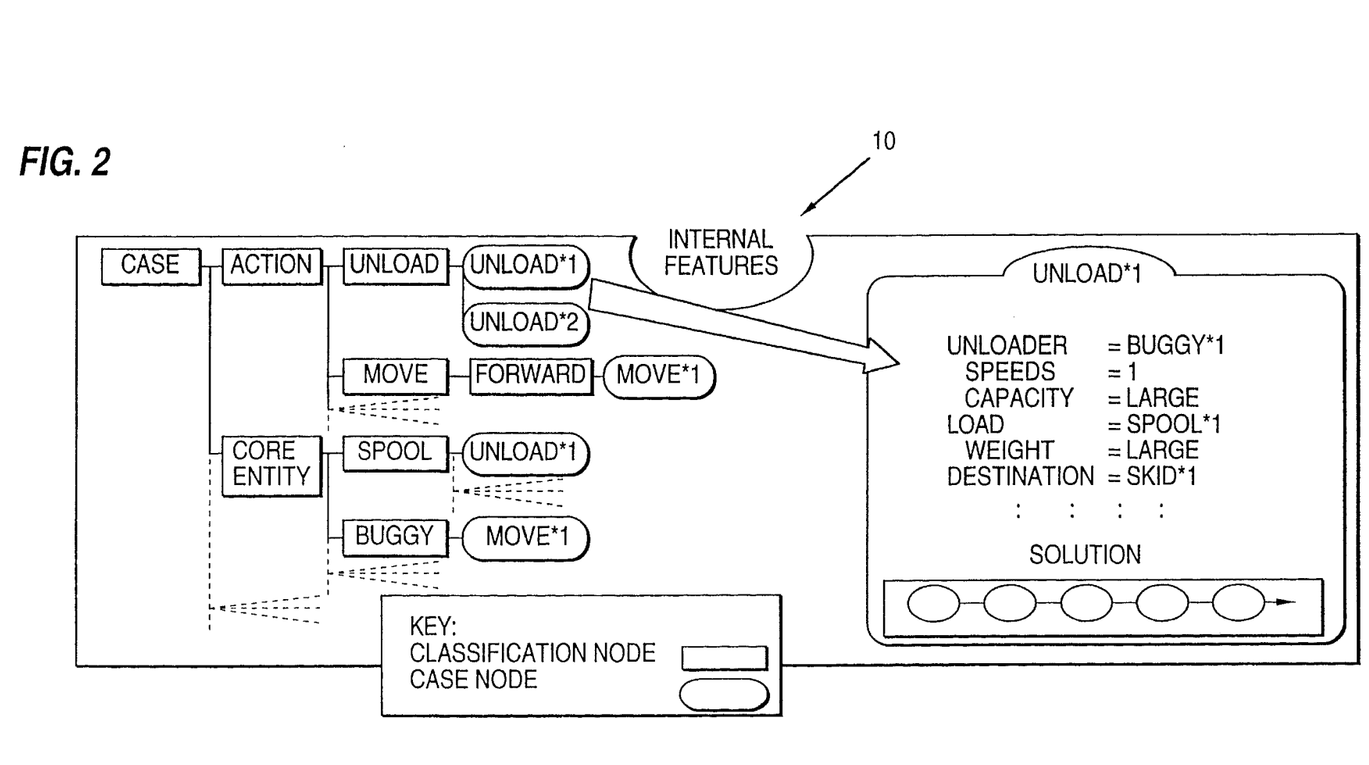
FIG. 2 is a diagram showing a case-base forming part of the apparatus.

The case-base is illustrated in more detail in FIG. 2. The case-base 10 comprises a taxonomic ("is a")structure of classification nodes which are interlinked according to their classification features. These classification nodes form paths to case nodes, each of which contains data for a specific software code module which has previously been generated for a particular target specification. Each case node has a number of internal features including a number of classification features. The set of classification features for each node defines a path to the node within the case-base 10. The set of internal features of each case node may be regarded as attributes, and these are added to as new paths to the node are developed. The righthand portion of the diagram 10 shows a set of internal features for a case node referred to as Unload*1. The partonomic structure of these case node in this embodiment includes top level cases (TLCs) and a number of detailed cases (DCs). However, it is envisaged that intermediate levels may also be included, if required.

Figure 3:
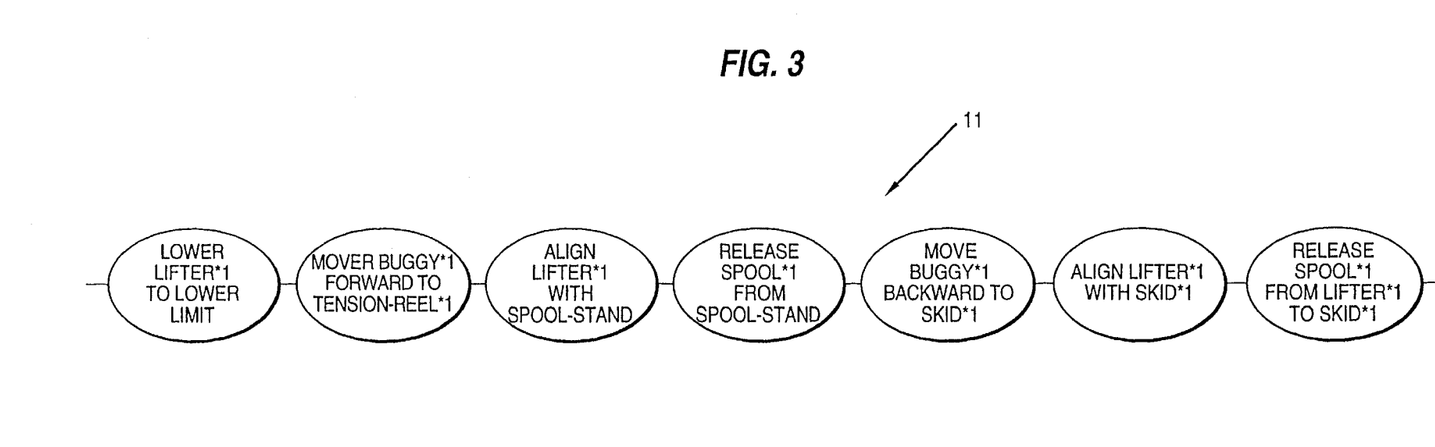
FIG. 3 is a diagram showing a portion of the case-base.

A top level case 11 is shown in FIG. 3. It will be noted that the top level case does not reference the detailed cases directly- instead, link descriptions are used which define the parameters of the appropriate detailed case. These links allow for greater flexibility during the automatic design process by providing access to all detailed cases in the case-base so that one may be chosen which best fits the current situation. An important aspect of the automatic design process is that a top level case adaptation involves retrieving and adapting detailed cases which correspond to the top level case link descriptions. A disadvantage of this feature which allows versatility is that a considerable control problem for the automatic design process is introduced. The following description of the process shows how this control problem is overcome.

Figure 4:
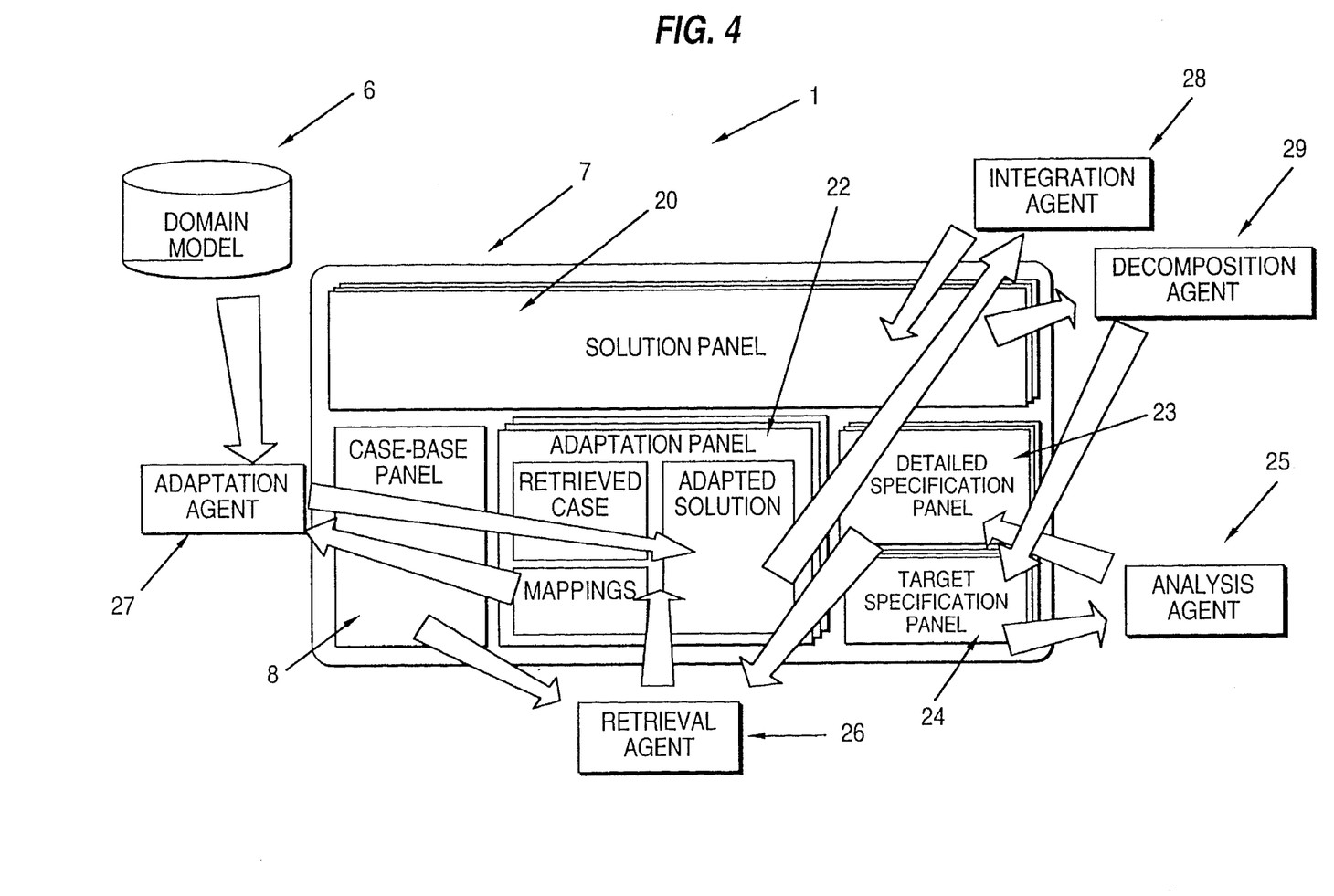
FIG. 4 is a diagram showing the apparatus in more detail, and operation of the apparatus to carry out an automatic design process of the invention.

Referring now to FIG. 4, most of the apparatus 1 is shown in more detail, and arrows between the various processors or processing agents and panels help to illustrate the automatic design process of the invention. In FIG. 4, parts similar to those described with reference to the previous drawings are identified by the same reference numerals. The memory circuit 7 includes a solution panel 20 which at the beginning of any process is empty and thus, the solution panel 20 is simply a set of memory locations which have been mapped for a particular use. In addition to the solution panel 20 and the case-base panel 8, there is an adaptation panel 22 which includes a retrieved case sub-panel 22(a), a mapping sub-panel 22(b)and an adapted solution panel 22(c). These sub-panels are all empty at the start of the process and are simply partitioned initially for their particular uses. Other sets of locations of memory circuit 7 which have been mapped to act as panels for temporary holding of data includes a detailed specification panel 23 and a target specification panel 24.

The set of processing or agents 4 of the apparatus 1 include an analysis agent 25, a retrieval agent 26, an adaptation agent 27, an integration agent 28 and a decomposition agent 29. Operation of these agents is described below.

The case-base panel is initialized before a particular automatic design process is initiated. This contains the addresses to allow access of the various processing agents to the case-base 10. In general, the automatic design process of the invention involves initialization of the target specification panel 25 by writing a description of the target specification at a high level.

After initialization, the analysis agent 25 reads the high level target description from the panel 24 and transforms it into a more detailed frame-based description. This transformation process involves the retrieval of all knowledge pertinent to the target problem, and the result is a frame representation of the target specification with additional details determined from the domain model 6.The detailed specification is written to the detailed specification panel 23.

Subsequently, the retrieval agent 26 reads the detailed specification and identifies classification features within it. It then uses the classification features to form a path in the case-base 10 to one or more case node. Subsequently, the retrieval agent 26 identifies internal features in the panel 23, and by comparing with those of the accessed case node, it determines the closest match case. This is then retrieved. Mapping links identifying differences and similarities between the detailed specification and the retrieved case are determined. The case is then written to the retrieved case sub-panel 22(a)in the adaptation panel 22, and the mapping links are written to the mapping sub-panel 22(b).

Typically, a retrieved case will not satisfy the requirements of the target problem, and, accordingly, adaptation is required. In the invention, the adaptation steps are carried out in both an automatic and possibly an interactive manner.

Operation of the adaptation agent 27 involves initially performing a rudimentary adaptation of the retrieved case using the mapping so that it conforms as closely as possible to the target specification. The adaptation agent 27 includes several sub-processing agents each of which is a constructed to carry out subsequent automatic adaptation using domain knowledge captured in the domain model 6 to perform a more detailed adaptation of the retrieved case, the result of which is generally referred to as an adapted solution. It is after successive refinement of the retrieved solution which does not achieve the target specification that interactive inputs may be required from a user. This aspect of the invention ensures maximum flexibility in that while in many cases a solution would be generated automatically, user interaction is allowed where required.

Operation of the decomposition agent 29 involves simply taking each link description of a top level case and writing it in turn the target specification panel 24 so that further analysis, retrieval and adaptation cycles are invoked. The integration agent 28 operates to integrate the components of the solution in the solution panel 20.

Figure 5:
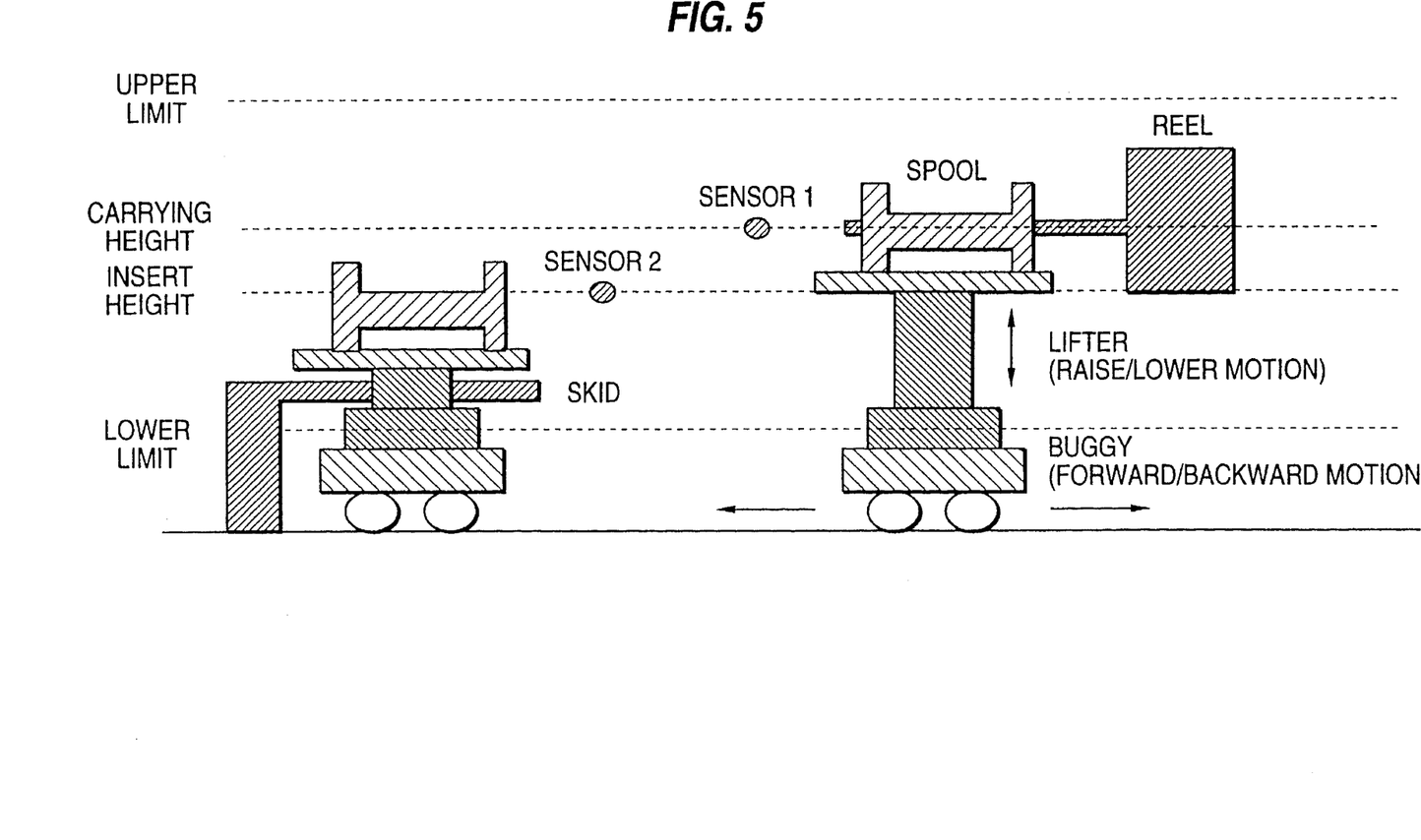
FIG. 5 is a diagrammatic view showing a situation for which vehicle control software code is to be developed.

To help understand the process of the invention, a particular example is now described with reference to FIG. 5 to 9, inclusive. In this example, the automatic design process is to generate plant control software code for controlling autonomous vehicles in a steel mill environment involved in loading and unloading of metal coils during the milling process, as illustrated in FIG. 5. The target software code should control unloading of a spool from a tension reel to a loading bay (a skid) using a two speed buggy. Two sensors, namely sensor 1 and sensor 2 are used. The steps involved in this operation includes movement of the buggy to the tension reel and alignment with the spool. The spool is released onto the buggy, which can then transport its load to the skid before releasing it onto the skid platform. Vehicle control is achieved by sensor activity. For example, in order to move the buggy to the tension reel, it is first set in motion, then at some later time the sensor indicating arrival at the tension reel is activated, causing the buggy to stop. This action is captured in the code section referred to as Forward*1.

Figure 6:
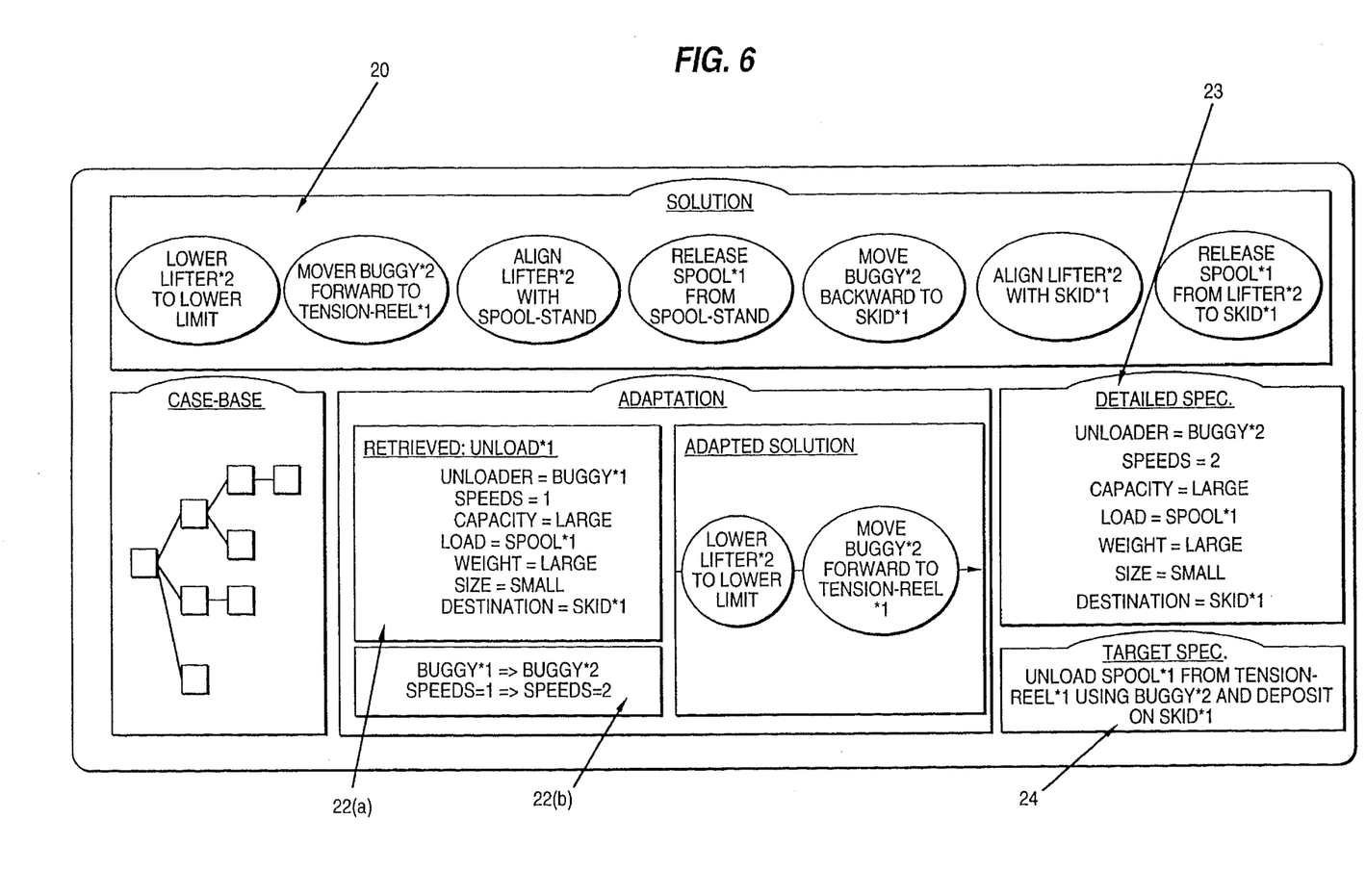
FIGS. 6, 7, and 8 are diagrams showing contents of a memory circuit of the apparatus during operation of the process.

In the automatic design process of the invention, there is a first cycle which is illustrated in FIG. 6. The cycle starts with the target specification being initially written to the panel 24. This is transformed by the analysis agent 25 into the frame structure of internal features shown in the detailed specification panel 23. Activation of the retrieval agent 26 causes the top level case referred to as Unload* 1 (see also FIGS. 2 and 3) to be retrieved and placed in the retrieved case sub-panel 22(*a*). This retrieved case is similar to the target specification except that instead it uses Buggy*1, a one speed buggy, rather than Buggy*2, a two speed buggy. This discrepancy is captured by the retrieval agent 26 and is written to the mapping sub-panel 22(*b*). In turn, the adaptation agent 27 reads the contents of the mappings sub-panel 6 and uses this information to change the link description of Unload*1 appropriately, as can be seen in the adapted solution sub-panel 22(*c*). The adapted top level case is picked up by the integration agent 28 and is written to the solution panel 20.

Having established a top level case to use as a decomposition/integration template, the process continues by in subsequent cycles retrieving and adapting a new (detailed) case for each component of the top level case.

Figure 7:
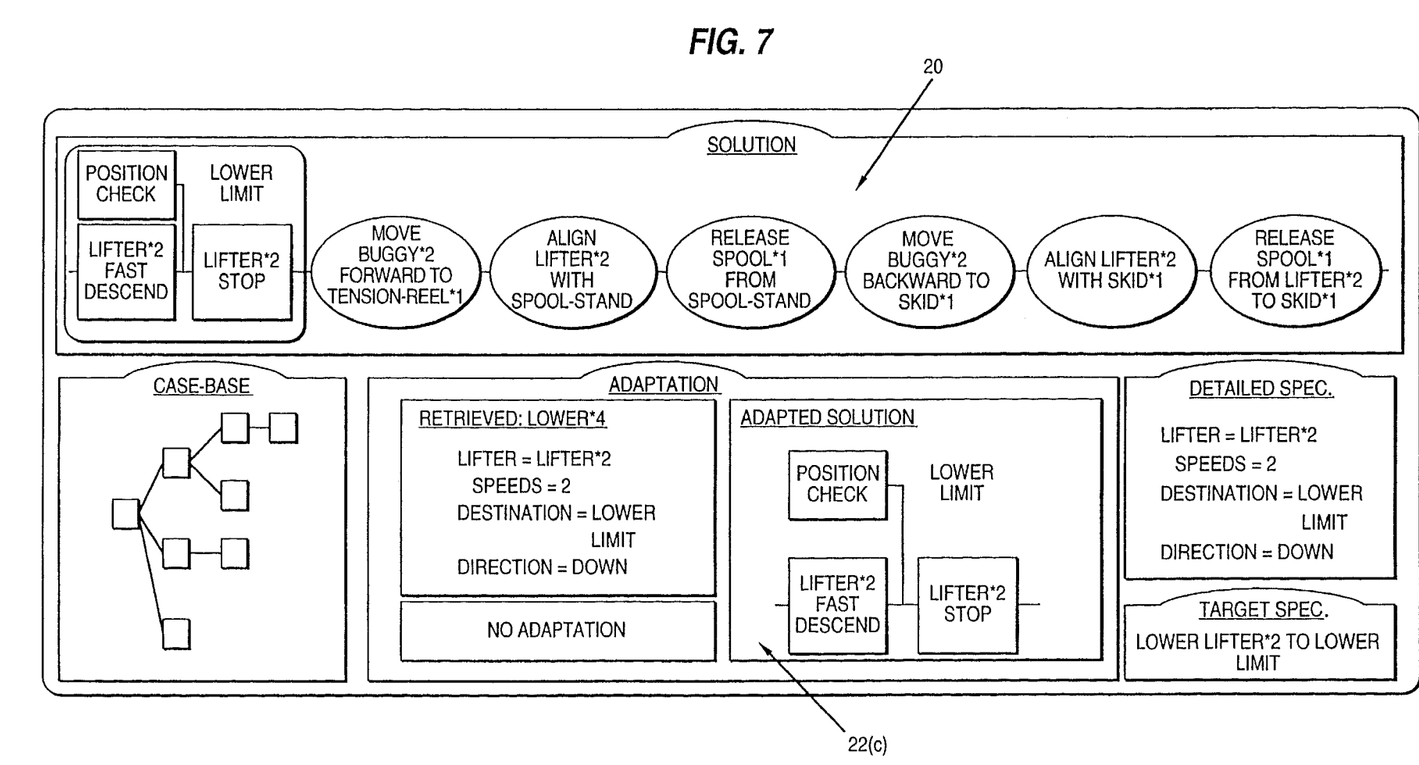

In particular, referring to FIG. 7, the second cycle of the process is illustrated. In this cycle, the decomposition agent 29 has written the first link description to the target specification panel 24. This in turn causes the retrieval and adaptation of an appropriate case from the case-base 10. This is a detailed case, and thus the integration agent 28 must integrate the adapted solution into the target top level case at the appropriate place. This is shown in FIG. 7 in which the adapted solution in the panel 22(C) has been written to the solution panel 20.

It is worth noting that ordinally the detailed case Lower*1 was linked to Unload*1. However, the retrieval operation of this cycle returns to the detailed case Lower*4 since it fits the target situation better than Lower*1 does. Thus, clearly the use of the link description adds greater flexibility to the process, relieving the adaptation problem somewhat. These advantages would be clearly understood if one considers what would happen if there was a direct link employed to specify the component cases of the top level cases.

Figure 8:
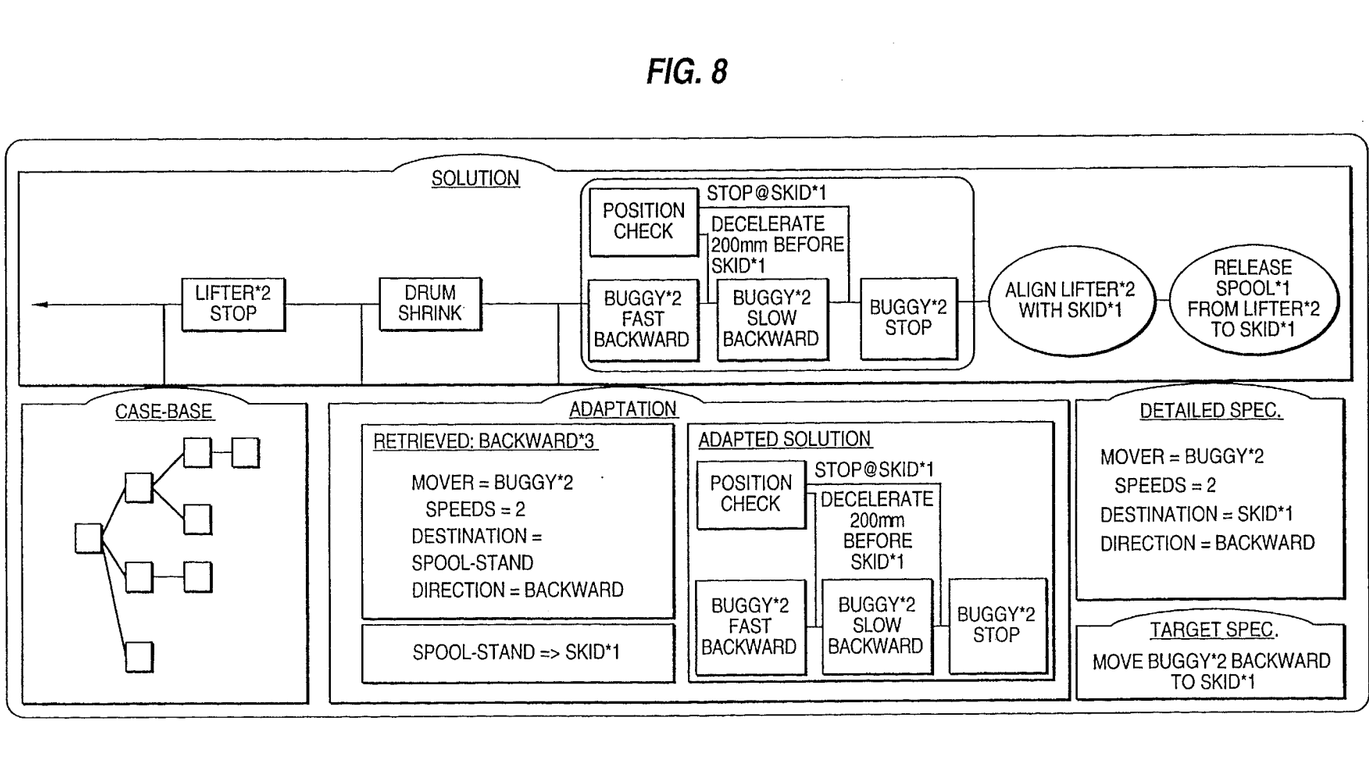
Figure 9A:
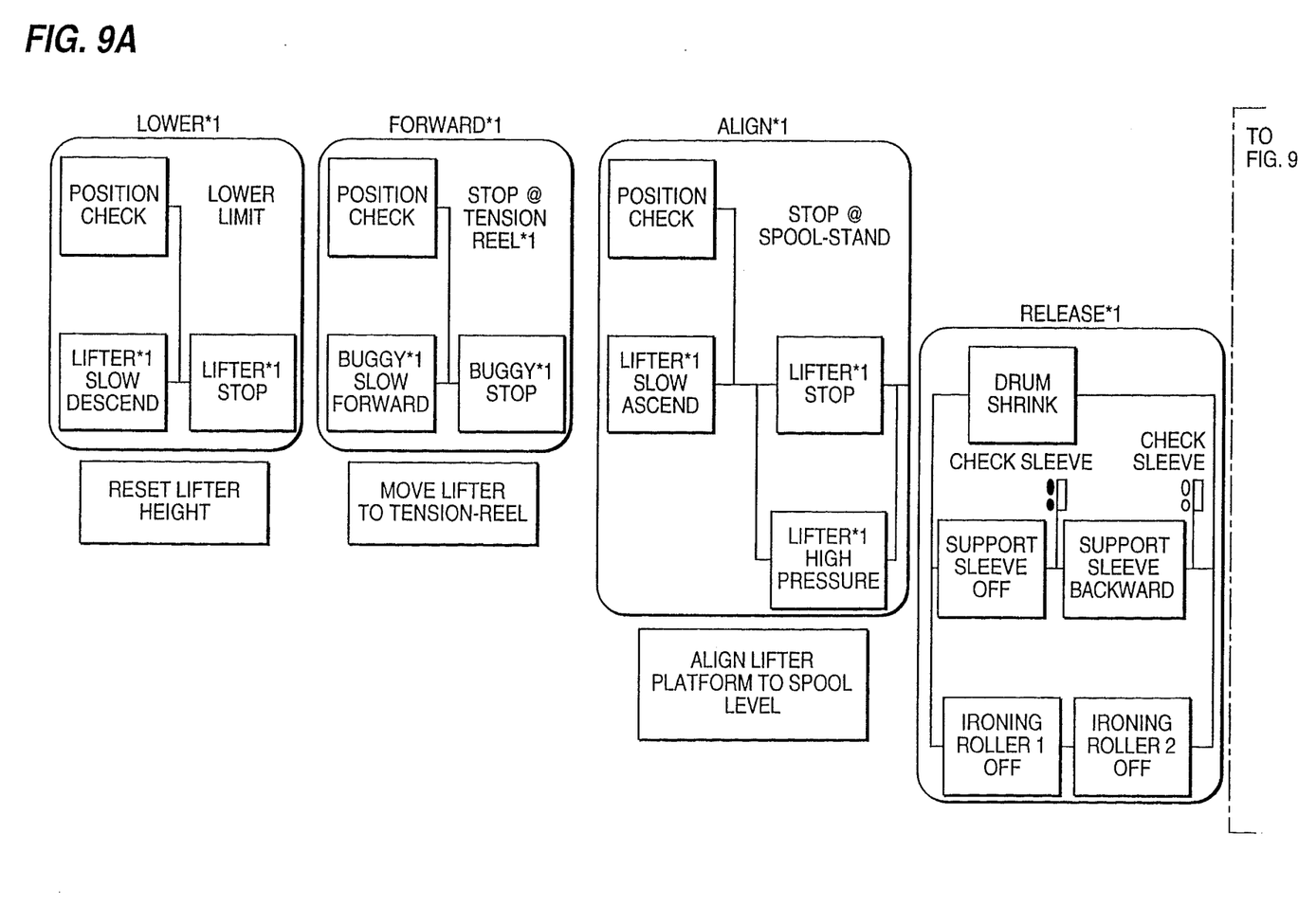
FIG. 9 is a representation of a solution generated by the process and apparatus of the invention.
Figure 9B:
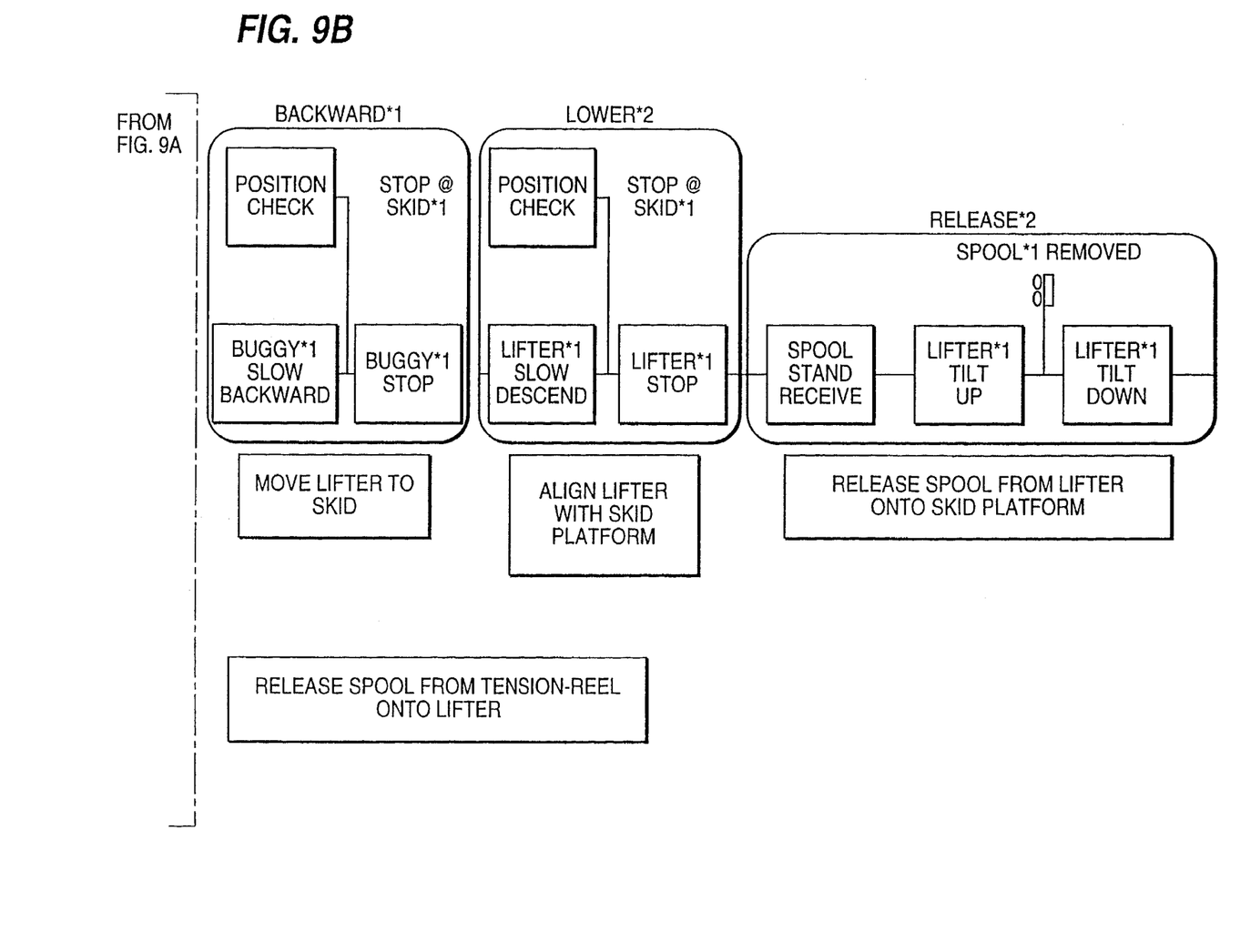

Referring now to FIG. 8, the k'th cycle is illustrated in which an appropriate detailed case is retrieved as in the first cycle. However, a direct match was not achieved and thus detailed case adaptation must be carried out. As in the case of adapting the initial top level case, a rudimentary direct mapping form of adaptation is carried out to rectify the discrepancies between the retrieved detailed case and the target specification, namely, the destination of the movement action is changed from spool-stand to Skid*1. The adapted solution is then integrated into the solution panel 20. An example of a final solution is shown in FIG. 9. It will be appreciated that this solution is suitable for carrying out the task which is described by the target specification.

It will be appreciated that the process of the invention allows for automatic design in an efficient manner by mirroring the manner in which humans approach problem solving. This is achieved because it makes use of existing cases, as a human would do and because a solution is developed in successive refinement cycles. Further, the manner in which existing cases are utilized is extremely efficient, for several reasons. One reason is the manner in which the case-base is constructed in both a taxonomic and a partonomic structure. The taxonomic structure allows for fast retrieval of a case, while the partonomic structure allows for flexibility in linking of top level cases to detailed cases so that the amount of adaptation required is kept to an absolute minimum. It will be appreciated that it is only during adaptation that a user may be required to take part in an interactive inputting session, and the partonomic structure of the case-base reduces this to a minimum. The manner in which the cycles are invoked may vary. For example, where there are additional layers to the top level case and the detailed level cases, all detailed cases may be retrieved for a particular top level before the processing agents input the next top level case to the target specification. Alternatively, the processing agents may not go to lower level for a case until all other cases have been brought to the same level.

It will also be appreciated that the successive refinement cycles are carried out in a controlled manner because independent processing agents are used, the links between stages of a cycle via the memory circuit. This leads to effective control because of simplicity.

The invention is not limited to the embodiments hereinbefore described, but may be varied in construction and detail.

What is claimed is:

1. An automatic design process carried out by an apparatus comprising a memory circuit; a plurality of processing agents; a non-volatile memory device storing a case base having paths comprising classification nodes linked according to classification features which they store, the paths terminating in case nodes, each case node storing features and a case; and an interface, the process comprising the steps of:

partitioning the memory circuit into a plurality of panels, each associated with at least one processing agent and having a pre-defined automatic design function, at least some of said panels being for temporary storage of data and being cleared on initialization of the apparatus;

completing initialization of the apparatus by writing a design task detailed specification having a frame-based description in a pre-defined format to a specification panel of the memory circuit;

performing a processing operation with a retrieval processing agent comprising the steps of:
    identifying classification features in the detailed specification and using said classification features to determine paths through the case base to case nodes,
    comparing the features of the identified case nodes with those of the detailed specification to determine a closest match case node, and retrieving the case of said closest match case node,
    writing the retrieved case to a retrieved case panel of the memory circuit, and
    writing mapping links identifying the differences between the retrieved case and the detailed specification to a mappings panel of the memory circuit, said mapping links being associated with adaption modules for performing modifications to adapt for the differences; and adapting at least part of the retrieved case with an adaption processing agent by retrieving the mapping links and activating the associated adaption modules, and writing an adapted case to an adaption panel of the memory circuit;

wherein the processing agents of the apparatus are activated in an automatic manner by operation of a write function of the apparatus, said write function carrying out write operations to the memory circuit for all processing agents upon receipt of each write instructions therefrom, and upon receipt of each write instruction automatically determining associated processing agents and timing data by reference to a look-up table and transmitting activation signals to the associated processing agents.

2. An automatic design process as claimed in claim 1, wherein the case node features include the classification features of all classification nodes in the paths to the case node.

3. An automatic design process as claimed in claim 1, wherein all features in a case node have associated values for the case.

4. An automatic design process as claimed in claim 1, wherein the adapted case is a top-level case having a plurality of link descriptions defining parameters for lower-level detailed cases and the process comprises the further steps of:

writing, through an integration processing agent, the adapted top-level case to a solution panel of the memory circuit;

successively writing, through a decomposition processing agent, each top-level link description of the adapted case to the specification panel to initiate retrieval of lower level detailed cases and generation of corresponding adapted detailed cases; and writing, through the integration agent, each successive adapted detailed case to the solution panel in a manner whereby a complete solution is generated in an integrated manner.

5. An automatic design process as claimed in claim 1, comprising the further steps, performed with a learning processing agent, of automatically retrieving adapted cases, determining classification features of the cases and writing the cases to the case base in nodes located using paths defined by the classification features.

6. An automatic design process as claimed in claim 1, wherein the memory circuit has a panel permanently storing domain knowledge, and the adaptation processing agent automatically retrieves domain knowledge during its operation, and automatically signals via the interface a requirement for interactive input if only part of the case is adapted.

7. An automatic design process as claimed in claim 1, comprising the further steps of an analysis processing agent reading a received target specification and automatically transforming it to the detailed specification with an analysis processing agent.

8. An automatic design apparatus comprising:
  a non-volatile memory device storing a case base having paths comprising classification nodes linked according to classification features which they store, the paths terminating in case nodes, each case node storing features and a case;
  a memory circuit;
  an interface;
  initialization means comprising:
    means for partitioning the memory circuit into a plurality of panels, each associated with at least one of a plurality of processing agents and having a predefined automatic design function,
    means for identifying those of the panels which are for temporary storage of data and clearing said panels, and
    means for writing a design task detailed specification having a frame-based description in a pre-defined format to a specification panel of the memory circuit;
  a retrieval agent comprising:
    means for identifying classification features in the detailed specification,
    using said classification features to determine paths through the case base to case nodes,
    comparing the features of the identified case nodes with those of the detailed specification to determine a closest match case node and retrieving the case of said closest match case node,
    writing said retrieved case to a retrieved case panel of the memory circuit, and
    writing mapping links identifying the differences between the retrieved case and the detailed specification to a mappings panel of the memory circuit, said mapping links being associated with adaption modules for performing modifications to adapt for the differences;
  an adaptation processing agent comprising means for adapting at least part of the retrieved case by retrieving the mapping links and activating the associated adaptation modules, and writing an adapted case to an adaptation panel of the memory circuit; and
  means for performing a write function comprising:
    means for carrying out write operations to the memory circuit, and
    means for activating processing agents by receiving a write instruction from a processing agent, automatically referring to a look-up table and determining associated processing agents and timing data, and transmitting activation signals to the associated processing agents.

9. An automatic design apparatus as claimed in claim 8, wherein the case node features include the classification features of all classification nodes in the paths to the case node.

10. An automatic design apparatus as claimed in claim 8, wherein all features in a case node have associated values for the case.

11. An automatic design apparatus as claimed in claim 8, further comprising:

an integration processing agent comprising means for writing adapted cases to a solution panel of the memory circuit; and a decomposition processing agent comprising means for writing top level link descriptions of an adapted case to the specification panel, whereby when the adapted case has link descriptions, retrieval of lower level detailed cases, generation of corresponding adapted detailed cases, and writing of each successive adapted detailed case to the solution panel for generation of a complete solution in an integrated manner takes place.

12. An automatic design apparatus as claimed in claim 4, further comprising a learning processing agent comprising means for automatically retrieving adapted cases, determining classification features of the cases, and writing the cases to the case base in nodes located using paths defined by the classification features.

13. An automatic design apparatus as claimed in claim 8, wherein the memory circuit has a panel permanently storing domain knowledge, and the adaptation processing agent comprises means for automatically retrieving domain knowledge during its operation, and automatically signalling via the interface a requirement for interactive input if only part of the case is adapted.

14. An automatic design apparatus as claimed in claim 8, further comprising an analysis processing agent comprising means for reading a received target specification and automatically transforming it to the detailed specification.

* * * * *